United States Patent
Araya et al.

(10) Patent No.: US 9,627,222 B2
(45) Date of Patent: Apr. 18, 2017

(54) METHOD FOR FABRICATING NITRIDE SEMICONDUCTOR DEVICE WITH SILICON LAYER

(71) Applicants: SUMITOMO ELECTRIC INDUSTRIES, LTD., Osaka (JP); SUMITOMO ELECTRIC DEVICE INNOVATIONS, INC., Yokohama-shi, Kanagawa (JP)

(72) Inventors: Takeshi Araya, Osaka (JP); Tsutomu Komatani, Yokohama (JP)

(73) Assignees: SUMITOMO ELECTRIC INDUSTRIES, LTD., Osaka (JP); SUMITOMO ELECTRIC DEVICE INNOVATIONS, INC., Yokohama-shi (JP)

( * ) Notice: Subject to any disclaimer, the term of this patent is extended or adjusted under 35 U.S.C. 154(b) by 0 days.

(21) Appl. No.: 14/989,249

(22) Filed: Jan. 6, 2016

(65) Prior Publication Data
US 2016/0118267 A1     Apr. 28, 2016

Related U.S. Application Data

(62) Division of application No. 14/331,744, filed on Jul. 15, 2014, now Pat. No. 9,263,544, which is a division
(Continued)

(30) Foreign Application Priority Data

Jul. 23, 2010 (JP) ................................. 2010-166321

(51) Int. Cl.
H01L 21/338      (2006.01)
H01L 21/322      (2006.01)
(Continued)

(52) U.S. Cl.
CPC ...... H01L 21/3228 (2013.01); H01L 21/3221 (2013.01); H01L 21/3245 (2013.01);
(Continued)

(58) Field of Classification Search
None
See application file for complete search history.

(56) References Cited

U.S. PATENT DOCUMENTS 8,815,664 B2     8/2014 Araya et al.
2008/0006846 A1  1/2008 Ikeda et al.
(Continued)

FOREIGN PATENT DOCUMENTS

JP     2005-260172 A     9/2005
JP     2009-200306 A     9/2009
(Continued)

OTHER PUBLICATIONS

Japanese Office Action dated Sep. 16, 2014, issued in corresponding Japanese Application No. 2010-166321; w/English Translation. (5 pages).

*Primary Examiner* — Daniel Whalen
(74) *Attorney, Agent, or Firm* — Westerman, Hattori, Daniels & Adrian, LLP

(57) ABSTRACT

A method for fabricating a semiconductor device including: forming a silicon layer on an upper face of a nitride semiconductor layer including a channel layer of a FET; thermally treating the nitride semiconductor layer in the process of forming the silicon layer or after the process of forming the silicon layer; and forming an insulating layer on an upper face of the silicon layer after the process of forming the silicon layer.

7 Claims, 3 Drawing Sheets

Related U.S. Application Data of application No. 13/186,111, filed on Jul. 19, 2011, now Pat. No. 8,815,664.

(51) Int. Cl.
    *H01L 29/20*     (2006.01)
    *H01L 29/66*     (2006.01)
    *H01L 29/778*     (2006.01)
    *H01L 21/324*     (2006.01)

(52) U.S. Cl.
    CPC .... *H01L 29/2003* (2013.01); *H01L 29/66462* (2013.01); *H01L 29/66522* (2013.01); *H01L 29/7787* (2013.01)

(56) References Cited

U.S. PATENT DOCUMENTS

| | | | |
|---|---|---|---|
| 2008/0230786 A1* | 9/2008 | Heikman | H01L 29/402 257/76 |
| 2008/0290371 A1* | 11/2008 | Sheppard | H01L 21/046 257/192 |
| 2009/0194791 A1 | 8/2009 | Kanamura | |
| 2010/0317164 A1 | 12/2010 | Komatani | |
| 2011/0193135 A1 | 8/2011 | Hagleitner et al. | |

FOREIGN PATENT DOCUMENTS

| | | |
|---|---|---|
| JP | 2009-272574 A | 11/2009 |
| WO | 2008041277 A1 | 4/2008 |

\* cited by examiner

METHOD FOR FABRICATING NITRIDE SEMICONDUCTOR DEVICE WITH SILICON LAYER

CROSS-REFERENCE TO RELATED APPLICATION

This application is a divisional of U.S. application Ser. No. 14/331,744 filed Jul. 15, 2014, which is a divisional of U.S. application Ser. No. 13/186,111 filed Jul. 19, 2011, now U.S. Pat. No. 8,815,664, issued Aug. 26, 2014, which is based upon and claims the benefit of priority of the prior Japanese Patent Application No. 2010-166321, filed on Jul. 23, 2010, the entire contents of which are incorporated herein by reference.

BACKGROUND (i) Technical Field

The present invention relates to a method for fabricating a semiconductor device.

(ii) Related Art

There is a case where a semiconductor device such as a FET (Field Effect Transistor) like a HEMT (High Electron Mobility Transistor) using a nitride semiconductor such as GaN (gallium nitride) is used as an output amplifier for high frequency. Japanese Patent Application Publication No. 2009-200306 (hereinafter referred to as Document 1) discloses an invention of forming SiN (silicon nitride) layers having different refractive index and removing impurity on a surface of a semiconductor layer.

SUMMARY

In the art of Document 1, current collapse may occur because impurity such as oxygen on the surface of the semiconductor layer captures a carrier such as an electron. When the current collapse occurs, an output of a semiconductor device may be reduced. It is an object of the present invention to provide a method for fabricating a semiconductor device that suppresses current collapse.

According to an aspect of the present invention, there is provided a method for fabricating a semiconductor device including: forming a silicon layer on an upper face of a nitride semiconductor layer including a channel layer of a FET; thermally treating the nitride semiconductor layer in the process of forming the silicon layer or after the process of forming the silicon layer; and forming an insulating layer on an upper face of the silicon layer after the process of forming the silicon layer.

DETAILED DESCRIPTION

A description will be given of a best mode for carrying the present invention.

[Embodiment]

As mentioned above, the current collapse may occur when impurity, especially oxygen, captures an electron or the like. An embodiment is forming a Si layer (silicon layer) on a face of a semiconductor layer and gettering oxygen with the Si layer. A description will be given of a method for fabricating a semiconductor device in accordance with the embodiment. FIG. 1A through FIG. 2B are a cross sectional view for illustrating a method for fabricating an FET of the semiconductor device in accordance with the embodiment. Each layer is schematically illustrated.

Figure 1A:
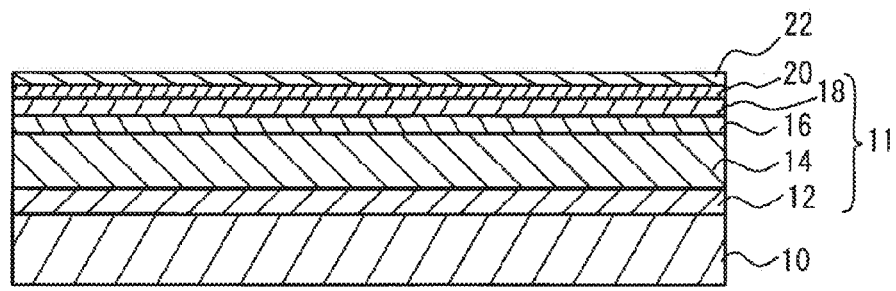
FIG. 1A through FIG. 1C are a cross sectional view for illustrating a method for fabricating an FET of a semiconductor device in accordance with an embodiment.

As illustrated in FIG. 1A, a semiconductor substrate made of a substrate 10, a barrier layer 12, a channel layer 14, an electron supply layer 16, and a cap layer 18 is prepared. The barrier layer 12, the channel layer 14, the electron supply layer 16 and the cap layer 18 act as a nitride semiconductor layer 11. The substrate 10 is, for example, made of SiC (silicon carbide), Si (silicon), sapphire or the like. The barrier layer 12 is, for example, made of AlN (aluminum nitride) having a thickness of 300 nm. The channel layer 14 is, for example, made of i-GaN (gallium nitride) having a thickness of 1000 nm. The electron supply layer 16 is, for example, made of AlGaN (aluminum gallium nitride) having a thickness of 20 nm. The cap layer 18 is, for example, made of n-GaN having a thickness of 5 nm. A Si layer 20 (silicon layer) having a thickness of 1 to 10 nm and a SiN layer 22 (insulating layer) having a thickness of 20 nm are formed on the cap layer 18 with a Plasma CVD (Chemical Vapor Deposition) method or the like. In details, the SiN layer 22 is formed after the Si layer 20 is formed. The refractive index of the SiN layer 22 is, for example, 2.05 to 2.45. The refractive index has a correlation with an atomic composition ratio of SiN. It is preferable that the SiN layer 22 is made of silicon-rich SiN, because SiN may getter oxygen. It is preferable that the SiN layer 24 is made of silicon-rich SiN as well as the SiN layer 22.

A description will be given of a condition of the plasma CVD method. First, a growth condition of the Si layer 20 will be described.

apparatus: Parallel plate type CVD apparatus
Furnace temperature: 250 to 350 degrees C.
Atmospheric pressure: 0.8 to 1.0 Torr (106.64 to 133.3 Pa)
Electrical power: 25 to 75 W
Material and flow rate:
$SiH_4$ (Silane): $N_2$: He=3 to 6 sccm: 200 to 600 sccm: 500 to 900 sccm ($5.07 \times 10^{-3}$ to $10.14 \times 10^{-3}$ Pa·m$^3$/sec: $338 \times 10^{-3}$ to $1014 \times 10^{-3}$ Pa·m$^3$/sec: $845 \times 10^{-3}$ to $1520.9 \times 10^{-3}$ Pa·m$^3$/sec)

Next, a growth condition of the SiN layer 22 will be described. The apparatus, the furnace temperature, the atmospheric pressure and the electrical power are the same as the Si layer 20.

Material and flow rate:
$SiH_4$ (Silane): $NH_3$ (ammonia): $N_2$: He=3 to 6 sccm: 0 to 2 sccm: 200 to 600 sccm: 500 to 900 sccm ($5.07 \times 10^{-3}$ to $10.14 \times 10^{-3}$ Pa·m$^3$/sec: 0 to $3.38 \times 10^{-3}$ Pa·m$^3$/sec: $338'10^{-3}$ to $1014 \times 10^{-3}$ Pa·m$^3$/sec: $845 \times 10^{-3}$ to $1520.9 \times 10^{-3}$ Pa·m$^3$/sec)

Figure 1B:
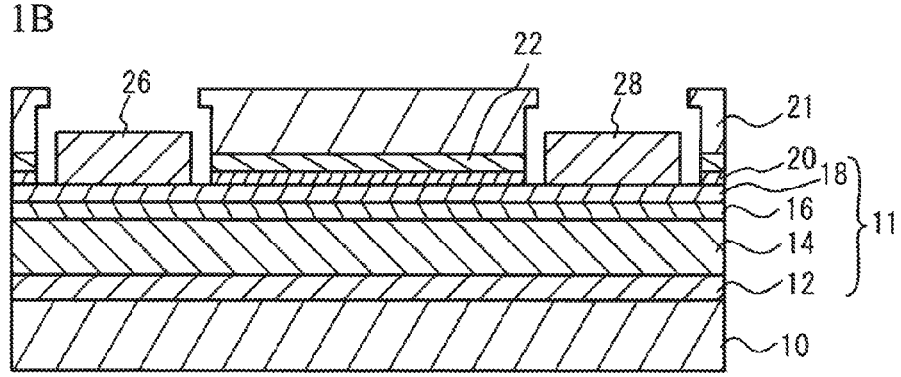

As illustrated in FIG. 1B, a resist 21 is formed on the SiN layer 22, and the Si layer 20 and the SiN layer 22 are subjected to a patterning with the resist 21. A source electrode 26 and a drain electrode 28 are formed on a part of the cap layer 18 that is exposed by the patterning. The source electrode 26 and the drain electrode 28 are an ohmic electrode in which Ti and Al are laminated from lower side in this order or Ta and Al are laminated from lower side in this order. The formation process of the source electrode 26 and the drain electrode 28 includes a thermal treatment process at temperature of 400 to 800 degrees C. in $N_2$ atmosphere (annealing process) in order to make favorable ohmic contact. In other words, the process of forming the ohmic electrode includes a process of annealing the ohmic electrode. That is, the thermal treatment process is performed after the process of forming the Si layer 20. The process of forming the SiN layer 22 is performed after the process of forming the Si layer 20 and before the thermal treatment process.

Figure 1C:
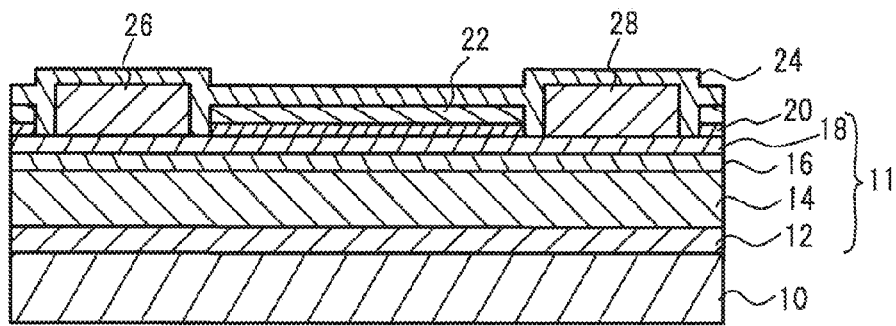

As illustrated in FIG. 1C, a SiN layer 24 having a thickness of 40 nm is formed on the cap layer 18, the SiN layer 22, the source electrode 26 and the drain electrode 28 with a plasma CVD method or the like. The refractive index of the SiN layer 24 is, for example, 2.05 to 2.45. The growth condition of the SiN layer 24 is the same as the SiN layer 22, and is omitted.

Figure 2A:
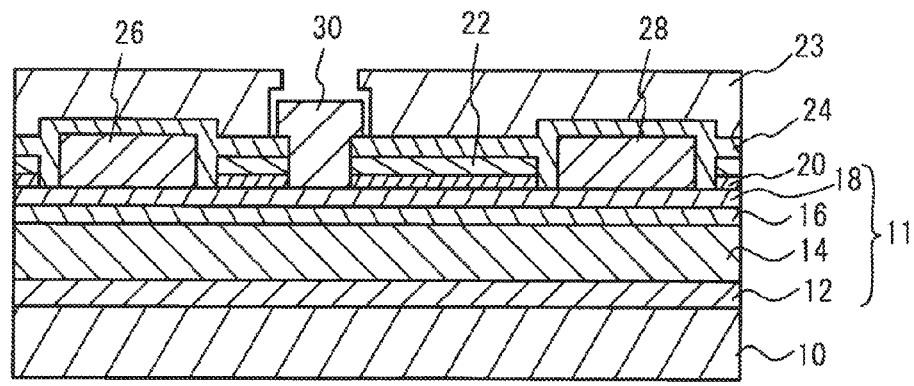
FIG. 2A and FIG. 2B are a cross sectional view for illustrating the method for fabricating the FET of the semiconductor device in accordance with the embodiment.

As illustrated in FIG. 2A, a resist 23 is formed on the SiN layer 24, and the Si layer 20, the SiN layer 22 and the SiN layer 24 are subjected to a patterning with the resist 23. A gate electrode 30 is formed on a part of the cap layer 18 that is exposed by the patterning. The gate electrode 30 has a structure in which metals such as Ni and Al are laminated from lower side in order.

Figure 2B:
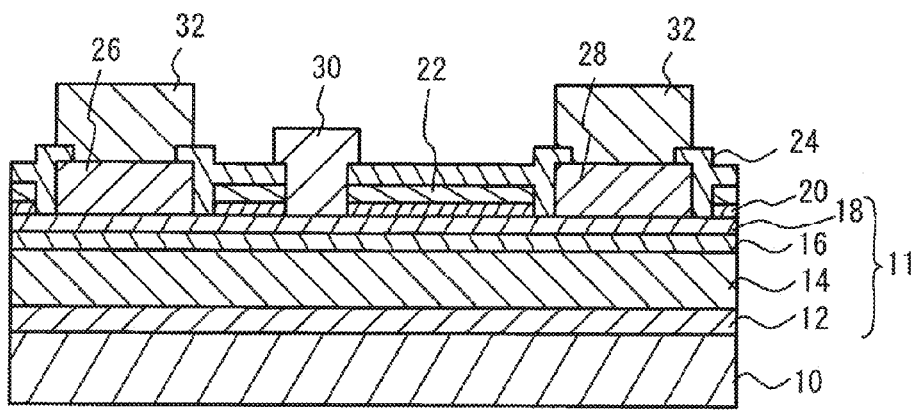

As illustrated in FIG. 2B, a resist (not illustrated) is formed on the SiN layer 24, and the SiN layer 24 is subjected to a patterning with the resist. A wiring layer 32 is formed on a part of the source electrode 26 and the drain electrode 28 that is exposed by the patterning. The wiring layer 32 is, for example, made of metal such as Au. With the processes, the FET of the semiconductor device in accordance with the embodiment is fabricated. In the embodiment, the HEMT using nitride semiconductor such as GaN is described as a semiconductor device. However, the semiconductor device is not limited to the HEMT.

In accordance with the embodiment, oxygen on the nitride semiconductor layer 11 may be gettered because the nitride semiconductor layer 11 is subjected to the thermal treatment process after the Si layer 20 is formed on the nitride semiconductor layer 11. The occurrence of the current collapse is suppressed because the oxygen capturing an electron of the channel layer 14 is gettered.

A description will be given of an experiment in which characteristics of the semiconductor device are measured.

The experiment compared a comparative embodiment in which the Si layer 20 was not formed with the embodiment in which the Si layer 20 was formed and the nitride semiconductor layer 11 was subjected to the thermal treatment process.

First, samples will be described. The method for fabricating the semiconductor device in accordance with the embodiment is illustrated in FIG. 1A through FIG. 2B. In the comparative embodiment, the Si layer 20 was not formed. The thickness of the Si layer 20 was 5 nm. The thickness of the SiN layer 22 was 25 nm. The thickness of the SiN layer 24 was 45 nm. The refractive index of the SiN layers 22 and 24 was 2.2. The width of the gate electrode 30 (a gate width) was 1 mm. The length of the gate electrode 30 (a gate length) was 0.9μm. The width direction is a vertical direction of FIG. 2B. The length direction is a lateral (right and left) direction of FIG. 2B.

Second, a measuring method will be described. With a three-terminal method, DC characteristics of each sample were measured under a condition that a pulse signal is input between the drain 28 and the source 24 and a pulse signal is input between the gate electrode 30 and the source 24 of a case where the drain to source voltage Vds is 0V and the gate to source voltage Vgs is 0V and a pinch-off case where the Vds is 50V and the Vgs is −3V. The voltage of the pulse signals was changed by 0.4V from −2V to 2V. A pulse width of the pulse signals was 4 μsec. A duty ratio was 1%.

Figure 3A:
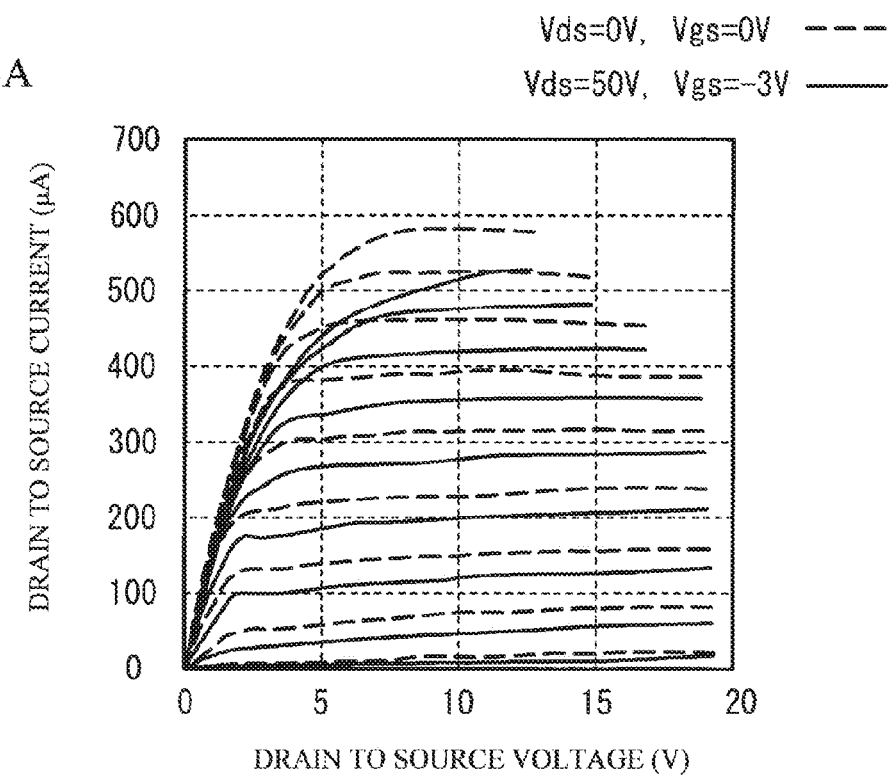
FIG. 3A and FIG. 3B illustrate a result of an experiment.
Figure 3B:
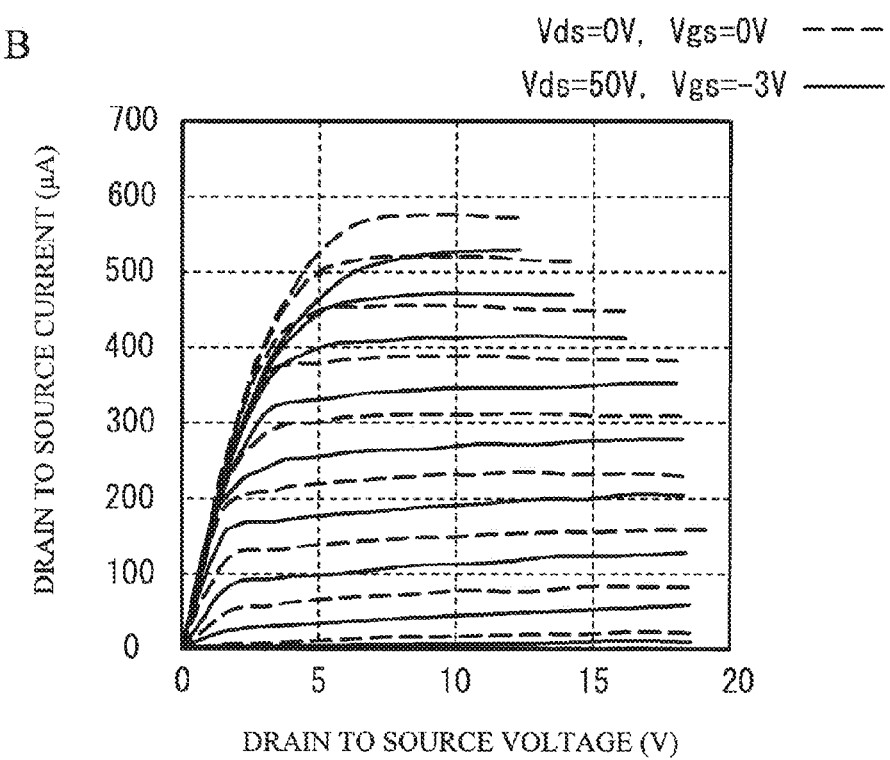

FIG. 3A and FIG. 3B illustrate a result of the measuring. FIG. 3A illustrates a measuring result of the comparative embodiment. FIG. 3B illustrates a measuring result of the embodiment. A horizontal axis indicates a drain to source voltage. A vertical axis indicates a drain to source current. A dotted line indicates a measuring result in the case of Vds=0V and Vgs=0V. A solid line indicates a measuring result in the case of Vds=50V and Vgs=−3V. The larger the difference between the dotted line and the solid line is, the larger the current collapse is.

The difference between the dotted line and the solid line of the embodiment in which the Si layer 20 illustrated in FIG. 3B was formed is smaller than that of the comparative embodiment illustrated in FIG. 3A. It is therefore confirmed that the current collapse is suppressed by thermally treating the nitride semiconductor layer 11 after forming the Si layer 20.

When the thickness of the Si layer 20 is excessively small, oxygen is not gettered sufficiently. On the other hand, when the thickness of the Si layer 20 is excessively large, the Si layer 20 may have electrical conductivity.

When the Si layer 20 has electrical conductivity, the characteristics of the semiconductor device may be degraded. The thickness of the Si layer 20 is preferably 1 to 10 nm, and more preferably 1 to 5 nm, in order to getter the oxygen sufficiently and suppress the conductivity of the Si layer 20.

As illustrated in FIG. 1A, in the embodiment, the process of forming the Si layer 20 and the process of forming the SiN layer 22 are performed in the same plasma CVD apparatus, and the semiconductor substrate is placed in the plasma CVD apparatus and these processes are performed in series without taking the semiconductor substrate from the plasma CVD apparatus. It is therefore reduce the cost of the semiconductor device because the processes are simplified. Further, it is suppressed that the Si layer 20 is exposed to external air and oxygen gets into the plasma CVD apparatus. However, the process of forming the Si layer 20 and the process of forming the SiN layer 22 may be performed not in series but separately.

The thermal treatment process is a process in which the semiconductor substrate is thermally treated in a tube-shaped furnace at temperature of 300 degrees C. or more for approximately 30 minutes. When the temperature is low, oxygen may not be gettered sufficiently. On the other hand, when the temperature is excessively high, the crystal of the nitride semiconductor layer 11 may be broken. Therefore, the temperature is preferably 400 to 800 degrees C., and more preferably 450 to 700 degrees C.

In the embodiment, the thermal treatment process is a process of annealing the ohmic electrode (the source electrode 26 and the drain electrode 28) that is included in the process of forming the ohmic electrode. Therefore, the thermal treatment process may be simplified. However, the thermal treatment process may not be included in the process of forming the ohmic electrode, but be performed in another process.

The thermal treatment process may be a process of heating the nitride semiconductor layer 11 with heat supplied in the process of forming the Si layer 20. For example, the process of forming the Si layer 20 includes thermal treatment process when the Si layer 20 is formed with a thermal CVD method. In concrete, the Si layer 20 is grown at temperature of 700 to 800 degrees C. with use of $SiH_4$ and $N_2$ as materials. In this case, when the Si layer 20 is formed, the Si layer 20 is also subjected to the thermal treatment process. Therefore, oxygen is gettered. Thus, the processes are simplified, and it is suppressed that oxygen is captured in the Si layer 20. The process of forming the Si layer 20 or the process of forming the ohmic electrode may include the thermal treatment process (the annealing process), and another thermal treatment process may be performed separately.

In the embodiment, the SiN layers 22 and 24 are formed on the Si layer 20. In this case, adherence of oxygen on the Si layer 20 is suppressed. Therefore, the current collapse is suppressed more effectively. Another insulating layer such as AlN may be used instead of the SiN layer. However, it is preferable that the insulating layer done not include oxygen causing the current collapse.

Contamination of impurity has only to be suppressed even if the SiN layers 22 and 24 are not formed. For example, the nitride semiconductor layer 11 may be subjected to the thermal treatment process under a condition that oxidation of Si is suppressed like a $N_2$ atmosphere after forming the Si layer 20.

The nitride semiconductor layer 11 may be another nitride semiconductor other than AlN, GaN or AlGaN. The nitride semiconductor is a semiconductor including nitrogen. For example, InN (indium nitride), InGaN (indium gallium nitride), InAlN (indium aluminum nitride), AlInGaN (aluminum indium gallium nitride) or the like may be used as the nitride semiconductor layer.

The present invention is not limited to the specifically disclosed embodiments and variations but may include other embodiments and variations without departing from the scope of the present invention.

What is claimed is:

1. A method for fabricating a semiconductor device comprising:
    forming a first layer consisting of silicon in contact with an upper face of a nitride semiconductor layer;
    forming a first opening and a second opening in the first layer;
    forming a source electrode on the nitride semiconductor layer through the first opening and a drain electrode on the nitride semiconductor layer through the second opening;
    performing a thermal treatment to the nitride semiconductor layer after forming the source electrode and the drain electrode; and
    forming a gate electrode in contact with the upper face of the nitride semiconductor layer between the source electrode and the drain electrode.

2. The method as claimed in claim 1, wherein temperature of the thermal treatment is 300 degrees C. or more.

3. The method as claimed in claim 1, wherein temperature of the thermal treatment is 400 to 800 degrees C.

4. The method as claimed in claim 1, wherein temperature of the thermal treatment is 450 to 700 degrees C.

5. The method as claimed in claim 1, wherein the first layer has a thickness of 1 nm to 10 nm.

6. The method as claimed in claim 1, further comprising forming a second layer on the first layer,
    wherein the second layer is an insulating layer.

7. The method as claimed in claim 6, wherein the second layer contacts with the upper face of the nitride semiconductor layer.

* * * * *